United States Patent
Maedler et al.

(10) Patent No.: US 11,712,759 B2
(45) Date of Patent: Aug. 1, 2023

(54) LEAD-FREE SOLDERING FOIL

(71) Applicant: Pfarr Stanztechnik GmbH, Buttlar (DE)

(72) Inventors: Ralph Maedler, Fulda (DE); Stephan Reichelt, Unterbreizbach (DE)

(73) Assignee: Pfarr Stanztechnik GmbH, Buttlar (DE)

( * ) Notice: Subject to any disclaimer, the term of this patent is extended or adjusted under 35 U.S.C. 154(b) by 0 days.

(21) Appl. No.: 17/790,847

(22) PCT Filed: Feb. 8, 2021

(86) PCT No.: PCT/DE2021/000021
§ 371 (c)(1),
(2) Date: Jul. 5, 2022

(87) PCT Pub. No.: WO2021/160196
PCT Pub. Date: Aug. 19, 2021

(65) Prior Publication Data
US 2023/0027510 A1 Jan. 26, 2023

(30) Foreign Application Priority Data

Feb. 12, 2020 (DE) ..................... 10 2020 000 913.1

(51) Int. Cl.
*B23K 35/26* (2006.01)
*B23K 35/02* (2006.01)

(52) U.S. Cl.
CPC ........ *B23K 35/0233* (2013.01); *B23K 35/262* (2013.01)

(58) Field of Classification Search
None
See application file for complete search history.

(56) References Cited

U.S. PATENT DOCUMENTS

| 3,900,153 A | 8/1975 | Beerwerth et al. |
| 4,650,107 A | 3/1987 | Keser |
| (Continued) | | |

FOREIGN PATENT DOCUMENTS

| CN | 106475702 A | 3/2017 |
| DE | 2228703 A1 | 1/1974 |
| (Continued) | | |

OTHER PUBLICATIONS

International Search Report in PCT/DE2021/000021, dated Apr. 15, 2021.

(Continued)

*Primary Examiner* — Daniel J. Schleis
(74) *Attorney, Agent, or Firm* — Collard & Roe, P.C.

(57) ABSTRACT

A lead-free soldering foil, for connecting metal and/or metal-coated components. allows the setting of a defined connecting-zone geometry and, with pores and/or voids being formed only to a minimal extent, achieves a high-temperature-resistant soldered connection that ensures great reliability even in staged soldering processes and increases the thermal conductivity of the connecting zone. The lead-free soldering foil is constructed so that, in a soft-solder matrix, two or more composite wires are each individually sandwiched by roll cladding between two soft-solder strips, parallel to one another and parallel to the edges of the strips. These composite wires include a core, which contains a higher-melting, stronger metal/metal alloy in comparison with the soft-solder matrix and around which a shell of another metal/metal alloy is arranged, and, after the roll-cladding operation, there is still 5 pm to 15 pm of soft-solder material arranged above and below at least one of the cores.

10 Claims, 4 Drawing Sheets

(56) References Cited

U.S. PATENT DOCUMENTS

| | | | |
|---|---|---|---|
| 9,873,171 B2* | 1/2018 | Li | B23K 1/0018 |
| 10,625,377 B2* | 4/2020 | Washizuka | B23K 35/0233 |
| 2011/0221076 A1 | 9/2011 | Takayama et al. | |
| 2019/0143459 A1* | 5/2019 | Bruck | B23K 35/0233 |
| | | | 228/121 |
| 2020/0203304 A1* | 6/2020 | Gulino | B23K 35/0244 |
| 2021/0154775 A1 | 5/2021 | Daoud et al. | |

FOREIGN PATENT DOCUMENTS

| | | |
|---|---|---|
| DE | 3442537 A1 | 5/1986 |
| DE | 10 2013 110 812 B3 | 10/2014 |
| DE | 10 2017 004 626 A1 | 11/2018 |
| DE | 10 2017 208 676 A1 | 11/2018 |
| JP | 2004174522 A * | 6/2004 |
| JP | 2004174522 A | 6/2004 |
| JP | 2009106993 A | 5/2009 |
| WO | 2011/112722 A1 | 9/2011 |
| WO | 2018/209237 A1 | 11/2018 |
| WO | 2018/210361 A1 | 11/2018 |

OTHER PUBLICATIONS

Thomas Rehtanz, "Technologie Der Metallformung Eisen-Und Nichteisenwerkstoffe", Deutscher Verlag fur Grundstoffindustrie, Leipzig 1990, pp. 35-36.

\* cited by examiner

LEAD-FREE SOLDERING FOIL

CROSS REFERENCE TO RELATED APPLICATIONS

This application is the National Stage of PCT/DE2021/000021 filed on Feb. 8, 2021, which claims priority under 35 U.S.C. § 119 of German Application No. 10 2020 000 913.1 filed on Feb. 12, 2020, the disclosure of which is incorporated by reference. The international application under PCT article 21(2) was not published in English.

BACKGROUND OF THE INVENTION

1. Field of the Invention

The invention relates to a lead-free soldering foil, with which metallic devices and/or metallized/metal-coated devices, i.e. metallic surface layers of neighboring devices, may be connected with one another.

2. Description of the Related Art

For connection of devices in the electronics industry, soldering materials are used in the prior art, usually as so-called soft solders both in the form of solder paste and also as proportioned, purely metallic solder preforms.

The reliability of soldered joints in the electronics and thus especially in the power electronics now requires very good mechanical, electrical and thermal properties of the solder materials and also of the connection zones produced with them, wherein their stability at present will be extended to increasingly higher temperature ranges.

For reasons of the environmental protection and of the health safety, the international trend in this context is directed toward the use of lead-free solder materials that are environmentally friendly and not harmful to health.

In the course of the switch to lead-free solders, numerous solder variations, for the most part based on tin, have been developed. In comparison with the lead-containing alloys, they indeed also have good mechanical, electrical and thermal properties, but they melt in the range of approximately 214° C. to approximately 250° C.

For higher working/service temperatures there are currently no lead-free soft solders that combine the temperature stability of the properties required in the power electronics with the necessary reliability and economic efficiency.

Thus, for high-temperature applications, for example, meaning in particular for working temperatures above 250° C., the need exists to develop new soft-solder (and also lead-free if at all possible) foils, which can be used inexpensively and which satisfy the requirements of temperature control needed in the power electronics, on the one hand so as not to damage the assemblies to be connected during the soldering process and on the other hand, also with a view to economic efficiency, especially with the soldering profiles typical for soft soldering, so as to achieve, in a process-temperature range typical of the lead-free soft solders, i.e. at preferably 250 to 300° C., but at least 20-30 K above the liquidus temperatures of the soft solders being used, and with the soldering times of shorter than 5 minutes standard in the prior art, and also without a subsequent heat treatment, and even without the additional exertion of a pressing pressure on the joint partners during the soldering, and independently of the atmospheres to be established in the soldering oven during the soldering in the soldering oven, with very minimum formation of pores and/or blowholes in the connection zone, a soldered connection that is stable at high temperatures and ensures a high thermal reliability of the connection zones between the neighboring devices even in stepwise soldering processes.

In order to be able to make such a connection between the devices, the solders must always be transformed to the molten state.

After the cooling and solidification of the solder, a strong, substance-to-substance connection is established between the components. It is a disadvantage of the soldering foils of the prior art that the solder, once transformed to the molten state, does not possess any kind of noteworthy internal resistance (surface tension of the molten solder) to shape changes due to externally acting forces.

These externally acting forces may be gravity forces, which result from the weight of the devices to be connected, but also shearing and compressive forces resulting from the connection technology, and also capillary forces, or forces caused by the influence of surface tensions, and also forces due to the atomic interaction forces in relation to the geometry of the joint point/connection zone during soldering.

These forces may cause the devices to be joined to tilt relative to one another during the soldering process.

Thereby, after the soldering, the solder thickness, viewed in cross section, is substantially thinner at one edge of the structure than at the opposite edge. These different cross-sectional thicknesses of the solder material over the surfaces to be soldered have a negative influence on the life of the soldered joint, while at the same time the thermal resistance at/in the "thick" regions is increased thereby, whereby undesired so-called "hot spots" are formed.

In extreme cases, it is possible for complete loss of the functionality of surface-mounted devices (SMDs) to occur, if these are located during the "tombstone effect" once the soldered joint has melted.

In the area of the mounting and connecting technology of the power electronics, soldered joints made by lead-free soldering usually have, in comparison with their counterparts having high lead content, a greatly shortened life, which is characterized by a smaller number of temperature load cycles until failure of the respective soldered assemblies.

High-lead solders are therefore still being used even today in sensitive areas, such as the aerospace or the military technology, even though the toxicity of the lead for people and nature is generally known.

Other solutions, such as the sintering with copper or silver powders in paste form or the use of very brittle high-gold soft solders, are very cost-intensive and therefore hardly come into consideration as alternatives in these areas.

Besides these thermomechanical advantages, lead-containing, especially high-lead solders have the advantage of becoming molten only at higher temperatures than do the other, conventional, lead-free soft solders. Thereby a safer design of so-called stepwise soldering processes, in which the individual levels of a module are mounted successively by soldering, is possible with high-lead solders.

Thus, for example, the first soldered joint may be made with a higher-melting, high-lead solder, while a subsequent soldered joint is then designed with a low-melting tin-base solder.

On the basis of a temperature difference of 80 K (Kelvin) and more in the melting ranges, in principle no danger exists in such designs that an already soldered component will become detached during a subsequent soldering step for the next component, since the temperature interval to the solidus temperature of the first solder is sufficiently large and can therefore be well controlled. If the situation is restricted to a lead-free soft solder of the general prior art, this temperature interval between the remelting temperature of the soldered connection that has already been soldered and the melting temperature of the soldered joint to be newly soldered is reduced to approximately more than 30 K for the different lead-free tin-base solders.

In industrial practice, however, an overheating of approximately 20-30 K above the liquidus temperature of the solders is generally standard for soldering in vacuum reflow soldering machines in order to produce high-quality connections.

Thus indium-containing and bismuth-containing solders, which may be used for a safer lead-free design of stepwise soldering, still exist as low-melting alternatives in the prior art.

However, the very low melting temperatures of the indium-containing and bismuth-containing solders, and in combination with these the poor creep resistance, greatly limit their use in the power electronics.

In addition, indium is a very expensive metal, such that its use as a large-area, high-volume system solder is often uneconomical.

On the basis of the soon-to-expire exempting regulations for the further use of lead-containing solders in the conventional economic areas not affected by exempting regulations for lead, alternative soldering materials are lacking that are capable of closing the gaps with respect to toughness and high desoldering temperature compared with the lead-containing solders.

In the prior art of mounting and connecting, concepts are known in which attempts are made by inserting shaped members, nets or rings to suppress a tilting of the devices to be soldered during the soldering process and to produce constant solder-layer thicknesses. It is disadvantageous in those methods that gas inclusions that lead to blowhole impaired soldered connections cannot be ruled out.

Thus, in DE 2228703 A1 and the corresponding U.S. Pat. No. 3,900,153 A, a soldering material was presented in which metallic, round or cylindrical particles are stirred into the soft solder surrounding them during the melting process or are introduced by rolling with the objective of ensuring a constant spacing between the parts of an electrical device to be soldered, in order to suppress a tilting, during the soldering process, of the devices to be soldered.

The metallic particles introduced into the soldering material in this solution are not supposed to become molten during the soldering process, in order to ensure a minimum spacing between the devices after the soldering process.

Since the particles are integrated geometrically arbitrarily and in no case reproducibly into the soft-solder material, at best a minimum smallest layer thickness, related to the height of the particles, can be achieved with this solution after the connection of the devices.

Both during the stirring of the particles into the soft solder surrounding them in the melting process and also during the rolling of the particles in soft-solder foils or soft-solder tapes, serious disadvantages, which are characterized above all by an increased number of cavities at the connection point, arise for the regions subsequently soldered with such material.

In JP 2004174522 A, another lead-free connecting solder and its method of manufacture are disclosed.

For the use of this lead-free connecting solder according to JP 2004174522 A, the exertion of a pressing force during the soldering process, i.e. the loading of the joint point with a weight, is absolutely necessary. Thereby this joining process is associated on the one hand with a high fabrication-related complexity and on the other hand this absolutely necessary pressing force may lead, since the semiconductor devices are now becoming increasingly thinner, to damage as far as breakage of the semiconductor devices and thereby have the consequence of loss of the electrical properties of the devices to be soldered.

In the connecting solder disclosed in JP 2004174522 A, metal nets are always used, in which copper wires among others having a wire diameter of 25 µm to 100 µm are woven together in the form of a mesh, wherein these Cu copper wires either are cleaned cost-intensively in vacuum or under inert argon gas at approximately 400° C. to 600° C. for 30 minutes before the joining with the soft-solder foils, or must be coated with tin having a layer thickness of approximately 1 m before the joining with the soft-solder foils.

These nets that have been cleaned or coated with Sn are then stacked one above the other in sandwich manner singly or even multiply, respectively between two soldering foils of tin, having a foil thickness of respectively 20 µm to 250 µm and, after which all parts of the connecting solder stacked one above the other in sandwich manner, i.e. the soldering foils and the net/s, are compressed in a "percentage height reduction" (determined from the difference between the total starting height of all parts of the composite solder stacked one above the other in sandwich manner and the final height relative to the total starting height of all parts of the composite solder stacked one above the other in sandwich manner in %) by 20% to 30% into a composite solder either in a very uneconomical process, discontinuously by lamination pressing or effectively continuously by roll cladding.

According to the joining method used in conjunction with JP 2004174522 A, it is not possible to ensure, due to the complex geometry of the metallic nets, especially in the region of the node points, a complete substance-to-substance flow around the wire inserts by the surrounding soft-solder matrix under the specified process conditions (at a height reduction of 20%-30%) (reference to JP 2004174522 A, FIGS. 5 and 6). Therefore cavities remain in the hard-to-reach interstices in the region of the node points of the nets. In addition, the soft-solder foils are at best in light contact in the region of the mesh openings under the specified process conditions. However, no strongly adhering, substance-to-substance connection between the Sn foils being used can be established under the process conditions proposed in JP 2004174522 A.

Therefore the metal nets disposed in the Sn solder by means of this solution disclosed in JP 2004174522 A can be integrated only with low adhesive strength in the Sn solder and in addition they simultaneously contain many cavities/blowholes.

The gaps between the wire node points of the metallic fabric cannot be closed with soft solder either by the tinning of the metal nets or by the pressing or the roll cladding.

The gas bubbles embedded in the composite solder of the solution according to JP 2004174522 A preferentially accumulate at the wire node points and become fixed there, and they can be removed to only a very small extent, even under vacuum, during the soft soldering.

Therefore a high percentage of porosity (even after a cost-intensive soldering process under vacuum) remains in the connecting layer during use of this soldering foil according to JP 2004174522 A.

On the basis of the insulating action of the gas inclusions, these gas inclusions necessarily impair the thermal conductivity to the extent that the thermal conductivity of a joint point joined according to JP 2004174522 A is even poorer than the thermal conductivity of a monolithic solder.

Further disadvantages also result from the fact that the node points of the metal nets to be integrated necessarily are always situated with their doubled wire thicknesses directly next to non-overlapped, single wire portions, and at the same time both of these are also situated next to mesh cavities.

During pressing of the soft-solder foils into these grid structures of the metal nets, the soft-solder foil materials being used have to overcome forming resistances that are directly next to one another and therefore oppose the flow of material to completely different extents, whereby stress conditions (shear stresses, tensile stresses) that directly oppose the substance-to-substance establishment of adhesion locally and are therefore non-beneficial develop between the connection partners.

In addition, during the percentage height reduction of 20% to 30% proposed in JP 2004174522 A, the impurities of the tape surfaces accumulate between the tapes pressed to the composite solder, and then lead to poorer-quality soldered joints during soldering.

All of these already explained disadvantages of the teaching in JP 2004174522 A additionally have the consequence that the joint partners brought into operative connection, i.e. the metal nets and the Sn foils, tend to a "detachment" from one another during mechanical stress and strain on the composite.

Already the least mechanical stresses and strains in the subsequent processing steps of the composite foil, such as, for example, the shearing forces during stamping of the foils, therefore lead to a delamination of the components, i.e. on the one hand to a delamination of the nets from the foils, but on the other hand also to detachment of the tin foils from one another.

This then necessarily has very high and also cost-intensive rejection rates as a consequence.

Certainly the disadvantage of the too-low adhesive strength can be mitigated at the costs of the likewise desired, raised remelting temperature, for example by imposing the restriction of combining only thick soft-solder foils with thin wire weaves.

The teaching according to JP 2004174522 A therefore also contains the proposal among others that the disadvantage of the remaining cavities, or the regions not surrounded by soft-solder flow, be mitigated at the costs of the raised remelting temperature, by providing that thick soft-solder foils are combined with thin wire weaves, so that more wire regions can be surrounded by soft-solder flow.

However, a soldering foil structured in such a way can in no case then ensure the effect, likewise described in JP 2004174522 A, of the formation of intermetallic phases having a raised remelting temperature, since the requirements to be met by soft solder on the metal nets for a binding via intermetallic phases to the joint partners during soldering are simply too demanding.

Therefore, although an increase of the wire surface of the wire weaves surrounded by soft-solder flow in the soft-solder matrix is indeed possible in this solution according to JP 2004174522 A, it is necessarily associated with a significant lowering of the high remelting temperature desired for safe stepwise soldering processes, as a consequence of the lack of binding of the metal nets to the joint partners via intermetallic phases.

However, since a raised remelting temperature and mechanically longer-lived connections with the solution proposed in JP 2004174522 A can be ensured only when intermetallic phases are formed between the metal nets and the joint partners, relatively small layer thicknesses of soft solder between the copper wires and the joint partners are necessarily required, since intermetallic phases with the net material of the metal nets, the Cu, are formed only under these framework conditions.

On the basis of the very large surface of the Cu fabric used in JP 2004174522 A, however, the intermetallic phases are then formed in such a large volume extent in the soldered joint that the soldered joints are embrittled, since, after the soldering process, too little ductile soft solder remains that could take over the compensation for the thermomechanical stresses that are developed during the soldering process and that result from the different coefficients of thermal expansion of the devices/materials participating in the joint connection. This has the consequence that the weakest joint partners then break, in this case the electronic devices.

In soldered connections having a very high proportion of intermetallic phases, the problem arises that only substrates having electrical devices that do not have any great difference in the coefficients of thermal expansion relative to one another can be joined, since otherwise shear stresses in the semiconductor may cause a break of the semiconductor during soldering, since no ductile soft solder that could absorb these stress peaks/stress overloads is available in the soldered connection. In soldered connections favorable for the thermomechanical stress and strain, which preferably consist completely of soft solder, which absorbs the thermal stresses during soldering by deforming, the problem arises of achieving a soldered connection that is resistant to high temperatures and ensures a high thermal reliability of the connection zones between the neighboring devices even in stepwise soldering processes.

In this connection, it is pointed out in JP 2004174522 A that the optimum thickness of the composite solder is 150 μm, and that it may be used up to a thickness of 250 μm since, at thicknesses of the composite solder equal to 250 μm and more, the electrical and thermal resistance of the connection point become too large, so that then, for example, the temperature can no longer be sufficiently dissipated from the electronic devices.

It is also stated in JP 2004174522 A that, from a thickness of the composite solder of 80 μm and less, the stress dissipation can no longer be ensured, whereby cracks then develop.

This results from the fact that, according to JP 2004174522 A, the soft-solder layer is decreased extensively by the wire and/or the intermetallic phases formed during soldering with use of one or more wire weaves, such that only thin regions of "residual soft solder" remain distributed everywhere after the soldering process.

Since it is very difficult to ensure a defined geometry of the wire weave with the material composite manufactured according to the teaching of JP 2004174522 A, an exact structure of the soldered joint cannot be ensured with this material composite, especially for geometrically complex shapes, since the minimum spacing can be defined only over the periodically recurring wire node points.

A further material for diffusion soldering is disclosed in WO 2011/112722 A1. This material consists of a metallic carrier tape and a thin, lead-free, two-sided soft-solder overlay, which in a time-intensive soldering process is transformed as completely as possible into intermetallic phases. As explained in patent specification WO 2011/112722 A1, it is always to be considered additionally that it is always materials having at least similar coefficients of thermal expansion that will be joined.

Besides the time-intensive soldering process, this represents a substantial restriction for joining of traditional, silicon-base semiconductor devices, which then can be soldered only on substrates that possess a ceramic intermediate layer that compensates for the mismatch of the different coefficients of thermal expansion of the different materials and is known as AMB (active metal brazed), DCB (direct copper bonded) or DBC (direct bonded copper), such that only these expensive ceramic substrates can be used as materials. As likewise explained in WO 2011/112722 A1, the surfaces to be joined must also be additionally prepared separately with respect to roughness, waviness and flatness, in order to ensure adequate wetting.

From DE 10 2017 004 626 A1 filed by the Applicant, or from the corresponding WO 2018/210361 A1, a proven lead-free soldering foil for diffusion soldering and a method for its manufacture are further known, whereby metallic devices and/or metallized/metal-coated devices, i.e. metallic surface layers for neighboring devices to be soldered can be connected with one another in a process-temperature range typical for the soft soldering and in soldering times of shorter than 5 minutes, without a subsequent heat treatment and without the exertion of a pressing force during the soldering, in such a way that a continuous layer of a high-melting connection zone is obtained in the form of an intermetallic phase having a remelting temperature of higher than 400° C.

The lead-free soldering foil for diffusion soldering disclosed in this teaching contains a solder composite material that is manufactured by roll cladding such that a soft-solder matrix of exclusively compact particles of a high-melting metal component are completely embedded in lead-free soft solder in a lead-free soft-solder environment in such a way that these particles of the high-melting metal component distributed dispersedly in the soft-solder matrix have a thickness of 3 µm to 10 µm in the direction of the foil thickness, wherein the spacings of the particles relative to one another in the soft-solder matrix are 1 µm to 10 µm, and each of the particles of the high-melting metal component is enveloped all around by a 1 µm to 10 µm thick layer of the lead-free soft solder, and this soldering foil additionally has an outer jacket layer, which is adjacent to the metallic surface layers of the devices to be joined, and the layer thickness of which is 2 µm to 10 µm and which consists of soft solder.

By means of this lead-free soldering foil it is indeed possible to ensure a safe, inexpensive lead-free design of stepwise soldering, although no geometric control of the solder layer, especially in the case of a more complex geometry for a solder gap, is possible by means of this solution, for example to suppress a tilting, during the soldering process, of the devices to be soldered.

From the teaching disclosed in DE 10 2013 110 812 B3, and likewise from a variant of the teaching disclosed in DE 2228703 A1 and the corresponding U.S. Pat. No. 3,900,153 A, it is known to deposit high-melting particles on the surface of solder tapes and then to press these into the surfaces of the tapes by rolls or linear presses, in order in this way to obtain a soldering material that in turn contains high-melting particles, which then are supposed to ensure a homogeneous solder-layer thickness after the soldering.

This manufacturing method of rolling or pressing leads in this solution, as also in the solution explained in the foregoing, to serious disadvantages, since only weak binding forces between the particles and the soft-soldering material are created by the rolling or pressing.

In the loose composite manufactured by the rolling or pressing, the danger permanently exists that the higher-melting particles will already be lost before the soldering process by falling off or falling out either during transport or during other manipulations.

In addition, the surfaces of the particles become wetted with solder only when they sink into the molten solder, which leads, depending on quantity/number and type of the material, to gas inclusions, which necessarily lead to blow-hole-impaired soldered connections, with the consequence of a not inconsiderable weakening of the connection point due to wetting defects.

Other solutions, such as the solution described in DE 3442537 A1, for example, use metallic fabrics or structured foils of higher-melting metals (melting temperature of these metallic fabrics or structured foils is higher than that of the participating soft solder) in order to ensure a most uniform possible thickness of the soldered joints.

In the process, these metallic fabrics or structured foils are placed either under or over the soft solder prior to the soldering.

Likewise it is known to lay such nets between the structures and to fill them with solder paste.

A substantial disadvantage of the separate application of the nets and structured foils is that they must be infiltrated by the solder during the soldering process, or that they are initially in contact with at least one device surface to be joined and thereby prevent wetting by the solder.

For these service cases, the soldering profiles must be so designed that the thermal masses of the nets and foils are included in the calculations, thus representing a not inconsiderable expense for the creation of new soldering profiles, which additionally then also require longer soldering times compared with the conventional soft-soldering profiles (common in the prior art).

The soldering profile must be newly adapted for each new design of a soldered joint.

In the process, the time for the infiltration by the solder material must imperatively be considered, and also the time for a sinking of the net or of the profiled foils in the molten solder must be included in the calculations.

In the process, the problem always additionally exists of the design of the thickness of the nets and foils in comparison with the thickness of the solder layer.

Depending on complexity of the nets and foils, very low-viscosity solders must be selected.

In addition, the density difference between the material of the net and the material of the solder must be considered, in order to ensure sinking/submersion of the net into molten solder material. Frequent consequences in this situation are wetting defects, which then reduce the thermal conductivity am well as the mechanical stability of the soldered layer and thus significantly impair/reduce the reliability of a soldered joint produced in this way.

Since the nets or structured foils are not integrated in a preform (molded solder part) but are laid in loosely during buildup of the stack, this necessitates a separate insertion step, which in addition also necessarily adds significantly to the total fabrication time for the soldering process.

From WO 2018/209237 A1, a solder material is known in which wires having a diameter of 5 µm to 200 µm are added to the soft-solder tapes by melting or rolling, with the objective of enhancing the thermal conductivity of the soldered joints manufactured by this material composite.

With the material manufacturing method not described in more detail in WO 2018/209237 but outlined with key words, according to which a rolling of the wire into tapes or foils must be assumed, the surface regions of the wire rest openly on the surface of the composite.

No truly strong, substance-to-substance integration of the wire in the soft-solder tape can be achieved by rolling.

Thereby the danger always exists that, during the subsequent processing steps, such as stamping or bending, the wire will be "disengaged" from the soft solder before the soldering.

In addition, this means that the wire must first sink/be immersed in the molten soft solder during soldering, thus causing cavities and wetting defects.

Even in this solution, therefore, the disadvantages already described and common to all solutions cited heretofore exist, consisting in the fact that, even in the solder material fabricated according to WO 2018/209237 A1, small gaps, cavities or the like filled with atmosphere always remain, leading during soldering to blowholes and pores having the already explained disadvantages.

However, the material/preform cited in WO 2018/209237 A1 may also be produced by adding the wire to the molten solder.

In the process (in the case of wire/soft-solder combinations (wire of copper, tin-base soft solder)), a not inconsiderable part of the wire already passes into solution in the molten soft solder prior to the soldering.

Such a manufacturing method in which the wire is added to the molten solder is additionally very fabrication-intensive, since only discontinuous and low-quality primary forming methods, such as bar casting, and no continuous methods such as continuous casting, can be considered for this purpose.

Besides the enhancement of the thermal conductivity, the material described in WO 2018/209237 A1 is also supposed to have the positive side effect of controlling the solder-layer thicknesses during the soldering process.

In this connection, it is to be noted that, according to the current prior art, the soldered joints of a power semiconductor module between the base plate or the cold sink and the substrate are made with thicknesses/solder-layer thicknesses beginning from 250 µm up to approximately 400 µm, for reasons of thermomechanical long-term stability, at the expense of the increase of the thermal resistance.

The material described in WO 2018/209237 A1 is completely unsuitable for these soldered-layer thickness of 250 µm to approximately 400 µm that are common in the prior art since, even at a wire diameter of 200 µm, the structural components could still tilt by at least 50 µm relative to one another (for a solder-layer thickness of 250 µm) up to at most 200 µm (for a soldered-layer thickness of 400 µm); thus by 50% of the thickness of the planned solder-layer thickness in the latter case.

Due to this "tilting at the soldered joint", however, the objective (the task) of the invention aimed at by the introduction of the wires, the increase of the thermal conductivity of the soldered joint, is defeated, since tilted soldered joints are the main cause for the development of thermal hot spots.

In addition, it is to be noted in principle that a soldered connection favorable for the thermomechanical stress and strain should on the one hand contain, to a certain extent, intermetallic phases that are stable at higher temperatures and have higher-melting metals included in them (of Cu or the like), but in addition should simultaneously also still be ductile, creep-resistant, i.e. insensitive to thermal load cycles.

SUMMARY OF THE INVENTION

The task of the invention is therefore to develop a lead-free soldering foil having a thickness of 50 µm to 600 µm that permits the adjustment of a defined and reproducible connection-zone geometry, whether simple or else even complex configuration even after the soldering process, wherein the soldering process is able to take place even in a process-temperature range typical of the lead-free soft soldering, i.e. at preferably 250 to 300° C., but at least 20-30 K above the liquidus temperatures of the soft solders being used, and with the standard soldering times of shorter than 5 minutes typical for the lead-free soldering in the prior art, and also without a subsequent heat treatment, and even without the exertion of an additional pressing pressure on the joint partners during soldering, independently of the atmospheres to be adjusted in the soldering oven during soldering, wherein, with very minimum formation of pores and/or blowholes in the connection zone, a soldered connection will be obtained, which is stable at high temperatures, and which will ensure high thermal reliability of the connection zones between the neighboring devices even in stepwise soldering processes, in which the danger of a remelting of previously soldered regions exists, and which additionally ensures a geometrically exact connection zone that is highly accurate in the geometric dimensions and that in addition significantly improves the thermal conductivity of the entire connection zone and at the same time, by virtue of its ductility, suppresses/stops a crack propagation in the connection zone in case of material fatigue and in the process simultaneously absorbs the thermal stresses introduced by the soldering but also developed during the device service, and thereby, in operative general context by means of the solution presented here, extends the life of the connection zone by a multiple compared with a connection zone manufactured with soldering materials according to the prior art in mounting and connection technology.

According to the invention, this task is accomplished by a lead-free soldering foil (1) having a thickness of 50 µm to 600 µm, with which metallic devices and/or metallized/metal-coated devices, i.e. metallic surface layers of neighboring devices in novel ways even in a soldering process in/at a process-temperature range typical for the lead-free soft soldering, i.e. at preferably 250 to 300° C., but at least 20-30 K above the liquidus temperatures of the soft solders being used, and with the standard soldering times of shorter than 5 minutes typical for the lead-free soft soldering in the prior art, and also, independently of the atmospheres to be adjusted in the soldering oven during soldering, with very minimum formation of pores and/or blowholes in the connection zone are connected with each other such that a soldered connection is obtained, which is stable at high temperatures, and which ensures high thermal reliability of the connection zones between the neighboring devices even in stepwise soldering processes, in which the danger of a remelting of previously soldered regions exists, such that, on the basis of the properties according to the invention of the novel soldered connection to be ensured with the soldering foil, the aforesaid problems of the prior art are solved and, by virtue of the layouts possible according to the invention, complex geometric structures, as will also be found in future, especially in stacks with integrated mechatronic function, are possible.

It is also important that, if necessary, the soldering foil (1) according to the invention requires neither a subsequent heat treatment nor the exertion of an additional pressing pressure on the joint partners during the soldering.

In this context, it is important to the invention that the soldering foil (1) is compactly structured such that, in a soft solder matrix (2), which consists either of lead-free tin-base solders, pure tin, pure indium or alloys on the basis of indium, such as InSn48, two or more composite wires (3) are integrated respectively individually, parallel to one another and parallel to the tape edges in such a way that the composite wires (3), aligned along the rolling direction between two soft-solder foils or two soft-solder tapes, are clad in place and thereby disposed in substance-to-substance relationship in the soft-solder matrix by means of roll cladding in a "percentage height reduction of the starting tapes", determined from the difference between the total starting height of the tapes (6) (determined without including the height of the composite wires (3)) and the final height H of the composite foil (1) (with embedded composite wires (3)) relative to the total starting height of the tapes (6), in %, in the range from greater than 30% to at most 95%, preferably from 50 to 85%.

It is also important that the minimum permissible spacing between the cores (2) of the composite wires (3) is approximately 500 μm after the rolling process. Thereby it is ensured that ductile soft-solder volume still remains present in sufficiently adequate extent between the wires jacketed with intermetallic phases to be able to compensate, by elastic-plastic deformation, for the thermomechanical stresses, resulting from the different coefficients of thermal expansion of the joint partners, that develop during soldering and in the service situation.

At the same time, there is no danger with this spacing that the reaction products formed during soldering under reactive atmospheres will be retained in the soft-solder volume because of capillary effects.

It is further characterizing that the minimum permissible spacing of the cores (2) of the composite wires (3) relative to the outer edge of the soldering foil is approximately 500 μm after the rolling process.

Thereby it is ensured that the tensile stresses developed in the region of the tape edges during the roll-cladding process have no negative influence on the substance-to-substance integration of the composite wires (3) and that adhesion or binding defects that possibly develop thereby in the soldering situation could not lead to an increased porosity or blowhole formation.

The maximum spacings of the cores (2) of the composite wires (3) among one another and relative to the outer edge of the soldering foil after the rolling process then depend respectively on the width of the soft-solder tapes being used. Thereby it is ensured that, depending on application situation, the number of composite wires (3) and their exact positioning over the width of the tapes (6) can be arranged very flexibly and individually within the restrictions and limits mentioned in the foregoing and thus a specific solution can be realized for all common tasks of the mounting and connecting technology.

By means of this solder foil according to the invention, in which composite wires (3) aligned respectively individually and parallel to the tape edges, along the rolling direction, are permanently integrated in the soft-solder matrix (2) in a manner parallel to one another in completely substance-to-substance relationship, i.e. with a maximum adhesive strength, it is ensured that the forces developed in the subsequent processing steps, for example during stamping of the foils, in no case have the consequence of delamination of the components.

At the same time, the completely substance-to-substance integration according to the invention of the composite wires (3) in the soft-solder matrix (2) ensures that no cavities whatsoever remain in the interior of the composite after the roll cladding according to the invention with a "percentage height reduction of the starting tapes" in the range from greater than 30% to 95%, so that then gases also no longer have to be removed from the soldering foil (1) according to the invention during the soldering process, whereby the soft solder of the soft-solder matrix (2), in the soldering foil (1) according to the invention, always has the same technical properties as the monolithic starting soft-solder material.

It is also important, however, that the composite wires (3) respectively disposed individually in the soldering foil (1) have a core (4), which consists of a metal that is higher-melting and at the same time stronger compared with the soft-solder matrix (2), or of a metal alloy, such as of copper or a copper-base alloy, silver or silver-base alloys, nickel or nickel base alloys, gold or gold-base alloys, around which a jacket (5) of a different metal or of a different metal alloy, such as of pure tin or a tin-base alloy, or of indium or an indium-base alloy is disposed.

It is characterizing in this case that the jacket (5) of the composite wires (3) has a layer thickness of 2% to 20% relative to the total diameter of the composite wire (3).

A further important feature of the invention also consists in that, after the roll-cladding process, over and under at least one of the cores (4) of the composite wires (3) clad in place in the soft-solder matrix (2), a layer of soft-solder materials is still disposed, which is composed of the region of the soft-solder matrix (2) and the layer of the jacket (5) of the composite wires (3), and which in total then measures at least 5 μm at the thinnest location but at most 15 μm, preferably 5 μm to approximately 10 μm.

The soldering foil (1) according to the invention is produced by feeding an upper tape (6) of soft solder, a lower tape (6) of soft solder, as well as several composite wires (3) situated between the tapes (6) in defined manner to a roll gap for roll cladding.

Due to the forces causing the deformations for cross-sectional reduction, it is ensured that the individual devices of the soldering foil (1) according to the invention are joined to one another in substance-to-substance relationship as a material composite.

The material composite, in the form of the soldering foil (1) according to the invention, resulting from this roll-cladding process has, transverse to the tape length of the soldering foil (1), the appearance, for example, of a rectangular cross section, in the soft-solder matrix (2) of which the composite wires (3) are embedded in substance-to-substance relationship.

By means of the design of the materials and of the wire geometries of the composite wires (3), which in the starting condition may have a round or oval cross section, in conjunction with the special choice for the geometry of the tapes in the starting condition in interaction with the adjustment of the geometry of the roll gap, a large number of complex geometric arrangements may be produced for the interior of the soldering foil (referred to layout in the following). Due to the roll-cladding according to the invention, however, in general a flat product is always produced at first, corresponding to a first approximation to a polygonal geometry.

The spacing of the individual composite wires (3) among one another and also the roll-gap geometry itself is then always defined and reproducibly adjustable.

Since "quasi endless semifinished products" in the form of soft-solder foils or soft-solder tapes and composite wire are used as the starting products, the method for manufacture of the soldering foil (1) according to the invention is very effective and economical.

With the soldering foil (1) according to the invention, a composite is made available in which all materials are joined in completely substance-to-substance relationship and no gaps, cavities or the like filled with atmosphere remain.

Thus a falling out or slipping or other delocalization of the composite wires is completely ruled out during transport of the soldering foil according to the invention or during other manipulations with the soldering foil according to the invention.

By the fact that, according to the invention, only round or oval composite-wire cross sections are used as the semifinished product, it is ensured that these semifinished-product geometries are always very well "surrounded by flow" of soft solder during roll cladding.

By the fact that the composite wires (3) are completely surrounded by flow during the roll-cladding process, the blowhole and pore behavior during soldering with the soldering foil (1) according to the invention is just as slight as during soldering with monolithic soldering foils or solder preforms manufactured from them.

At the same time, the stress conditions that develop between the composite wire and the soft solder of the tapes (6) during roll cladding do not cause the forming capacity of the tapes (6) to be exceeded.

The forming capacity is the ability of the materials to change their shape under the influence of external forces—which produce stresses in the material—by plastic deformation to such a sufficiently large extent that the "material cohesion" is not lost.

As a consequence of this integration according to the invention of the composite wires in the soft solder, the composite wires are completely surrounded by soft solder in each case due to the process of roll cladding according to the invention.

According to the invention, it is ensured that, as soon as the solder becomes molten, all structural-part surfaces are immediately completely wetted and thus wetting defects can be completely ruled out.

By means of the solution according to the invention, however, it is also possible intentionally to arrange the integrated composite wires (3) nonuniformly in their cross-sectional geometries, in order to be able to recreate even such very complex geometries of a soldering gap.

Such very complex geometries of a soldering gap are currently required, for example, in conjunction with the mounting of power semiconductor modules having concave or convex structures of the soldering gaps between substrates and base plates or cooling elements.

With the soldering foils according to the invention, however, even much more complex geometries are realizable in the mounting and connecting technology.

This will be necessary in future, when the modules will also have to assume mechanical in addition to electrical functions and must be designed no longer in the standard "flat" configurations but instead in complex 3D structures.

As a consequence of the free choice of the geometric design of the cross-sectional shape of the soft-solder matrix, and in conjunction with the free choice of the shape and of the number of the composite wires (3) integrated into it, hardly any limits are imposed on the layouts.

From this soldering foil (1) according to the invention, it is then inexpensively possible, by stamping or combined stamping-forming processes, to manufacture the different solder moldings (8), so-called preforms, for the corresponding service geometry.

By means of the soldering foil (1) according to the invention, what happens in a conventional lead-free soft-soldering process with soldering profiles typical in the prior art for soft soldering in the prior art, in a process-temperature range typical for soft soldering, i.e. at preferably 250 to 300° C., but at least 20-30 K above the liquidus temperatures of the soft solders being used, and in soldering times of shorter than 5 minutes, so also at soldering temperatures of up to approximately 280° C. and in soldering times of 5 minutes, is then a transformation, during the soldering process, due to the metallurgical effects, of the soft-solder columns in, over and under the jacket region of the composite wires to higher-melting intermetallic phases around the core (4) of the respective composite wire (3), in such a way that complete bridges of higher-melting, intermetallic phases to the components to be connected are formed such that, after the soldering, only higher-melting, strong bridges are disposed in the region of exactly defined cross-sectional regions in the connecting zone (13) around the cores (4) of the composite wires (3). According to the invention, the soft-solder material of the original soft-solder matrix is still disposed between and beside these strong bridges in the connecting zone (13) after the soldering process.

The higher-melting, strong bridges formed according to the invention in the soldering process, i.e. the regions according to the invention of substance-to-substance connections between the devices to be joined, have substantially higher strength but in addition also a much higher remelting temperature compared with the soft-solder material of the soft-solder matrix neighboring these bridges.

Thus the bridges formed according to the invention from intermetallic phases solve two basic problems of the mounting and connecting technology that occur during stepwise soldering using conventional soft solders.

Firstly, due to the bridges having "higher-temperature stability" formed according to the invention between the components to be joined, a slipping of these components in the stepwise soldering process is prevented/avoided, since the bridges formed according to the invention are no longer able to melt at the temperatures in a soft-soldering process.

According to the invention, however, these bridges also ensure that, due to their higher mechanical stability, a crack propagation in case of material fatigue of the solder is stopped/suppressed at these bridges.

Since the ductile soft-solder matrix is always disposed between these very strong bridges, which function as crack-blocking elements, it is additionally able, according to the invention, to simultaneously dissipate, by plastic deformations, the stress overloads developed in the connection zone.

At the same time, these very strong, rail-like bridges cause a region "open to degassing" to remain during soldering beside/along the "rails" or between the neighboring "rails" and the surfaces of the neighboring device to be joined, which region on the one hand permits a degasification of the reaction products (i.e. the gas (steam or the like) formed as the reaction product from the reducing media used during soldering and the surface oxides of the joint partners) formed during soldering at the surfaces to be joined of the joint partners (i.e. between the surfaces of the devices to be joined (e.g. ceramic substrate (9), base plate (10) and the surfaces to be joined of the soft solder (1)) from the region of these surfaces of the joint partners, wherein this "region open to degassing", on the other hand, however, also makes it possible that the "atmospheres", which form in the cavities, present between the surfaces of the joint partners, which usually form on the basis of a geometry of the surfaces to be joined deviating from an ideal surface (due to roughness, waviness, score marks, scratches, etc.), are then able to escape during soldering.

On the whole, a completely novel soldered connection is produced by mean of the solution according to the invention which, besides the advantage of the exact geometric control of the soldered joint, substantially improves the process control of the soldering process during stepwise soldering and in addition simultaneously counteracts a material fatigue, wherein the life of a connection zone (13) produced with the soldering foil (1) according to the invention is significantly better (longer) compared with a connection zone (13) produced with conventional soldering materials of the mounting and connecting technology.

Advantageous embodiments, details and further features of the invention will become evident from the dependent claims as well as from the following description of the exemplary embodiments according to the invention.

BRIEF DESCRIPTION OF THE DRAWINGS

In the following, the invention will now be explained in more detail in conjunction with six diagrams of the solution according to the invention.

DETAILED DESCRIPTION OF THE PREFERRED EMBODIMENTS

Figure 1:
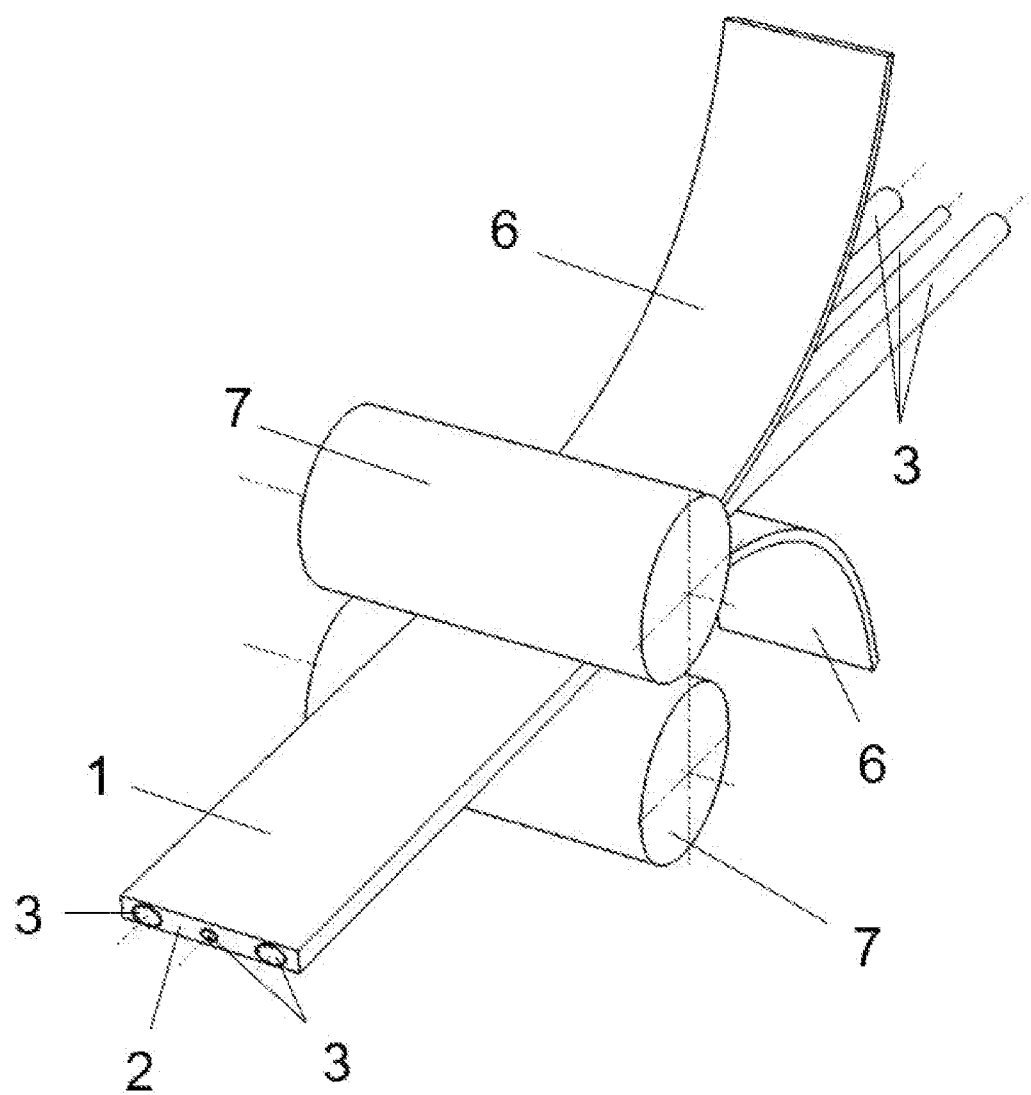
FIG. 1 shows the arrangement according to the invention for manufacture of the soldering foil 1 according to the invention.

FIG. 1 shows the arrangement according to the invention for manufacture of the lead-free soldering foil 1 according to the invention.

As illustrated in FIG. 1, starting materials to begin with are two foils or tapes 6 of soft solder, which are provided in degreased and in dirt-free surface quality.

For improved further processing, these tapes 6 may be brushed prior to roll cladding, in order to remove external elastic passivation layers and additionally to have the surface roughness necessary for the connecting to be performed subsequently in the roll gap.

These foils or tapes 6 are so disposed on the inlet side of the rolls 7 of a roll stand that the lower tape 6 of soldering material is threaded first through the roll gap.

Then the composite wires 3, which expediently are provided wound on spools, are applied centrally on the corresponding unwinder shafts.

The composite wire 3 may be provided in round or else oval cross sections.

Corresponding to the number of composite wires 3 to be integrated in the soldering foil 1, these are disposed between the tapes on the inlet side of the roll stand.

In a simple layout, the number of composite wires to be integrated is equal to two.

However, even more composite wires 3, for example five and more composite wires 3, may be used in a soldering foil 1 according to the invention. For this purpose, the geometric shape of the composite wires 3 and also their thickness may be selected differently.

A simple example provides that two composite wires, round starting shape and equal diameters will be used.

In a more complex example, three or more composite wires of different shape and above all different diameter may also be used.

As the starting material for the tapes 6, which produce the soft-solder matrix 2 after the roll-cladding process, all common, lead-free tin-base alloys may be considered, especially: Sn; SnAg3.5; SnCu3; SnCu0.7; SnSb5; SnSb8; SnAg0.3Cu0.7; SnAg1Cu0.7; SnAg3.8Cu0.7; SnAg3.0Cu0.5; SnAg0.4Cu0.5.

However, metals and alloys on the basis of indium may also be used, for example pure indium or InSn48.

For the core 4, especially metals and alloys of pure copper and copper-base alloys, pure silver and silver-base alloys as well as nickel and nickel-base alloys may be considered, above all in combination with tin-base alloys for the soft-solder foils to be used. However, gold and gold-base alloys may also be used in combination with indium-base solders, although this represents a cost-intensive example for a material combination.

For the connecting process during roll-cladding and also for the diffusion-soldering process, it is characterizing that the jacket 5 of the composite wires 3 consists of a different material than the core 4.

The peripheral layers of the jacket 5 (mainly zinc oxides), which are very brittle in comparison with the metal of the core 4, support the establishment of connection to the tapes 6 during the roll-cladding process, since these brittle layers of the jacket 5 already rupture at slight deformation and thereby make space for the connection-friendly material in the interior of the jacket layers.

In this case, it is immaterial whether the jacket 5 of the composite wire 3 was produced galvanically or else by dipping the core 4 in metal melts.

The thickness of the jacket layer may be from approximately 2% to 20% of the thickness of the total diameter of the composite wire 3.

As the "diffusion-soldered regions" around the core 4 of the respective composite wire 3 being used, the intermetallic phases formed according to the prior art or their combinations will represent the higher-melting phases, depending on choice of the materials being used.

In order to achieve remelting temperatures of the intermetallic phases of ≥400° C., material combinations such as tin-base solder as the soft-solder matrix 2 with cores 4 of the composite wires 3 of copper, silver or nickel wire, or indium-base solder as the soft-solder matrix 2 with cores 4 of the composite wires 3 of nickel or gold wire are desirable.

The respective soldering profile, i.e. the temperature-time regime during the soldering process, then always corresponds to the soft-soldering profile standard in the prior art for the respective material combination, with the process-temperature range typical for the lead-free soft soldering, i.e. at up to approximately 280° C. and in soldering times of shorter than 5 minutes, for example.

The embodiment of a soldering foil 1 according to the invention illustrated in FIG. 1 shows at the center a very thin composite wire 3, next to which two thicker, in this case equally thick composite wires 3 are disposed, one on each side. This embodiment is used in order to conform to a concave soldering gap and to ensure a geometric exactness that is as high as possible after the soldering.

Depending on requirement applicable to the geometry of the later soldering gap, however, any suitable number of composite wires 3 having different diameters may also be used.

According to FIG. 1, the composite wires 3 are threaded in a next process step through a guide die and then through the roll gap, and in the process are aligned with the lower tape 6, which has already been threaded through.

In the subsequent roll cladding, the guide die ensures that the composite wires 3 are clad in place only at the desired locations, and thus it also defines the spacing of the composite wires 3 relative to one another as well as the spacing of the composite wires 3 relative to the long edges of the soldering foil 1.

After the composite wires 3 have been aligned in this way with the lower tape 6, they are mechanically fixed on the outlet side of the rolls 7.

Next, the upper tape 6, which enters the roll gap between the rolls 7 above the composite wires, is threaded through the rolls and then aligned edge-to-edge with the lower tape 6.

It is advantageous to use foils or tapes 6 of soft solder having equal width.

For a continuous process, it is likewise expedient to use the material being used in wound form, in so-called coils.

After the tapes 6 and the composite wires 3 have been threaded in desired arrangement through the roll gap, the roll gap is closed.

The thickness of the resulting material composite tape is adjusted by the adjustment of the minimum spacing of the rolls relative to one another.

If the rolling process is now begun, the softer material of the solder flows, due to plastification of the metals in the roll gap, around the rounded regions of the stronger composite wires 3, molds these in place and reconnects with itself, so that a substance-to-substance material composite, the soldering foil 1 according to the invention, is joined. The "percentage height reductions of the starting tapes" necessary for this purpose during roll cladding (determined from the ratio, from the difference between the total starting height of the tapes 6 (determined without including the height of the composite wires 3) and (i.e. minus) the final height H of the composite foil 1 (with embedded composite wires 3), relative to the total starting height of the tapes 6, in percent), lie in the range from greater than 30% to 95% (of the total height of the starting tapes), depending on choice of the materials used for the soldering foils/soldering tapes and the respectively used composite wires, which are aligned individually and parallel to the tape edges, along the rolling direction.

If, for example, a round wire is used as the starting material of the composite wire 3, it will approximate an oval geometry in the process of forming in the roll gap.

As already mentioned, composite wires 3 that are already oval may also be used as the starting-material shape.

The rounded shape of the composite-wire surface is important for the production of the cladding.

Composite-wire cross-sectional geometries with pronounced edge shapes have no use within the scope of the solution according to the invention.

It is only with rounded shapes of the jacket surfaces of the composite wires 3 that the softer material of the soft-solder matrix 2 is able to flow in substance-to-substance relationship around the composite wire 3 during the forming process, without encountering too large resistances in the flow of substance while doing so.

In the process, the soldering material of the soft-solder matrix 2 is exposed to very large local degrees of deformation at the locations at which the composite wire 3 is surrounded by flow.

The round shape of the surface of the composite wires 3 improves an enclosing of the composite wires without losing the material cohesion of the solder (break/crack) and in this way makes it possible for the first time for even very thick composite wires 3, such as, for example, composite wires 3 having a diameter equal to 2.5 times the thickness of the (starting) tapes 6 of soldering material, to be integrated in substance-to-substance relationship without having to expect an internal or external damage to the composite.

It is only in this way that it is possible to obtain the necessary, very thin layers of soft solder of 5 µm to at most 15 µm, which are situated over and under the regions at least of one of the integrated wire cores 4 after the cladding process and are necessary for a diffusion soldering.

Within the scope of the process workflow according to the invention, it does not represent any problem to integrate, in the solder matrix, even composite wires 3 of very different thickness, or composite wires 3 that merely amount to only one third of the original diameter of the thickest composite wire 3, or in exceptions are even smaller.

Different alloys may also be used for the cores 4 of the integrated composite wires 3.

Examples are copper alloys of different strength or pure copper having different degrees of strain hardening.

The background for the use of alloys of different strength is that the different composite wires 3 are also deformed to different extents during roll cladding in comparison with the solder.

The composite wires 3 having the softer wire-core alloys become flatter and increasingly oval during roll cladding and in comparison take up less height in the overall composite in comparison with stronger metals and alloys.

By choosing alloys of different strength, it is therefore also possible to produce various geometric layouts of the soldering foil 1 according to the invention.

Depending on the metals used for the tapes 6, the soft solder matrix 2 and the composite wires 3, it may be necessary to heat the starting materials prior to or during entry into the roll gap, in order to achieve better formability.

The soldering foil 1 may also be rolled out to an even thinner soldering foil 1 in subsequent rolling steps.

The solution according to the invention likewise provides for manufacturing solder preforms from the soldering foils 1 according to the invention produced in this way, in order to undertake a very exact proportioning of the soldering foil 1 for the desired soldered joints. This may take place, for example, by methods such as stamping, laser cutting, micro-etching or conventional shearing methods.

Moreover, combined methods, which include cutting and simultaneous forming (deep-drawing, embossing) may also be employed for the manufacture of complex geometric solder preforms.

Since it is known that severely tilted soldered joints tend to fail mechanically and to lead to formation of undesired hot spots as homogeneously thick layers, many application situations require only two equally high composite wires 3, which are as thick as possible in the soldering foil 1 and thus are placed at an exact spacing relative to one another, and that the composite wires are integrated as close to the edge as possible, for example in a solder preform.

During the soldering process, a tilting of the components is then suppressed in this way and a solder layer as homogeneous as possible is ensured.

Figure 2:
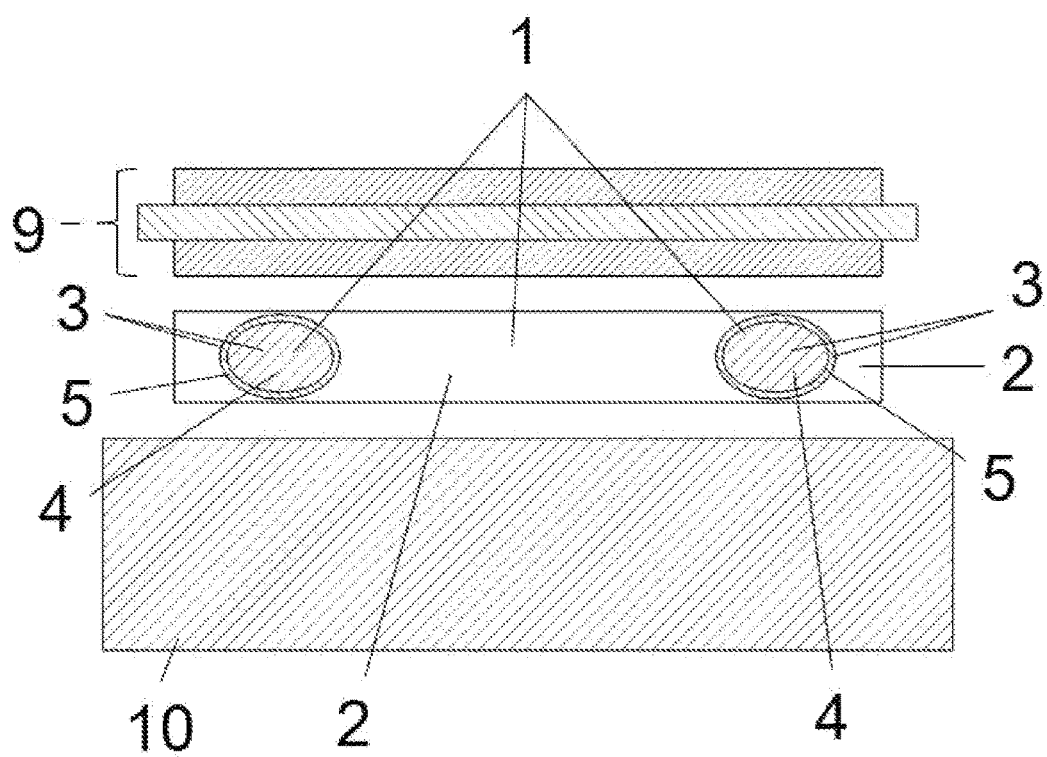
In FIG. 2, a solder preform consisting of a soldering foil 1 according to the invention and disposed between a substrate 9 and a base plate 10 prior to the soldering process is illustrated in a sectional diagram.

FIG. 2 shows a sectional drawing prior to the soldering process, in which a solder preform 8 consisting of the lead-free soldering foil 1 according to the invention is disposed between a ceramic substrate 9, which is used in the exemplary embodiment presented here and is also known as DCB, DBC or AMB, and a base plate 10.

This solder preform 8 consisting of the of the soldering foil 1 according to the invention and stamped out of the soldering foil 1 is constructed according to the invention in such a way that two composite wires 3 are clad in place in the soft-solder matrix 2, which in this exemplary embodiment consists of a lead-free tin-base solder, i.e. are integrated compactly in the soft-solder matrix, and according to the invention have a core 4, which consists of a metal or a metal alloy, in this case of copper, which is higher-melting and at the same time stronger compared with the soft-solder matrix 2, and around which a jacket 5 of a different metal or a different metal alloy, in this case of a tin-base alloy, is disposed.

According to the invention, this arrangement, after the "stack" has been produced, is heated in a soft-soldering process with a soldering profile typical for soft-soldering processes in a process-temperature range typical for soft soldering (i.e. at up to approximately 280° C. and in soldering times of shorter than 5 minutes), and in the process the soft-solder matrix is transformed to the molten state.

This may take place, as is standard in the prior art, for example in vacuum ovens, usually under the effect of reducing gases.

In the process, the molten solder spreads on the surfaces in contact with it.

Figure 3:
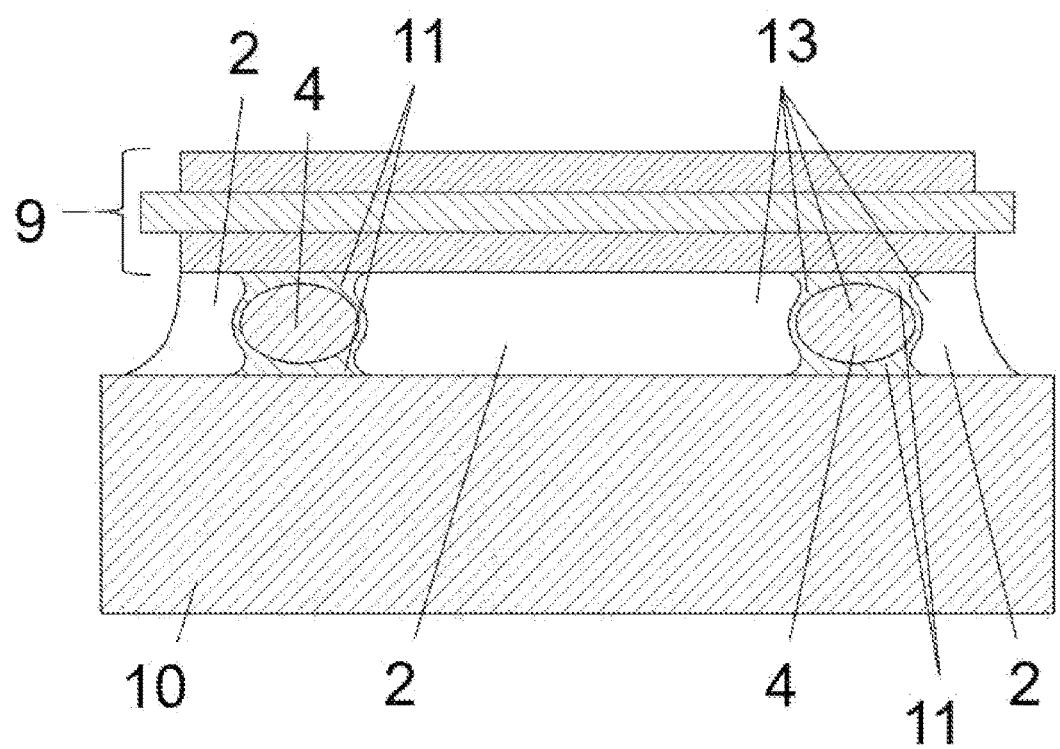
FIG. 3 shows the arrangement illustrated in FIG. 2 immediately after the soft-soldering process.

According to the invention, as illustrated in FIG. 3, diffusion zones, i.e. regions with new chemical composition, so-called intermetallic phases 11, extending up to the neighboring device surfaces (i.e. up to the substrate 9 and the base plate 10) and disposed between the solder and the materials to be wetted, are then formed around the composite wires due to diffusion processes between metal atoms from the composite-wire region and the molten solder.

Connection zones soldered with monolithic soft solders have, after the soft soldering, and considered over the cross section, a connection zone that consists of the starting ingredients and possesses the same chemical composition as before the soldering.

In contrast, if soldering is carried out with the soldering foil 1 according to the invention, regions having chemically changed composition are formed around the core 4 due to the diffusion processes between the composite wire 3 and the molten soft-solder melt that take place according to the invention during the soft-soldering process with soft-soldering profiles.

In the present exemplary embodiment, the SnCu3 solder is used as the solder matrix.

The composite wires 3 consist in the core 4 of unalloyed, pure copper with a jacket 5 of a tin-base alloy.

During soft soldering, intermetallic phases of Cu3Sn and Cu6Sn5 are formed according to the invention around these cores 4.

Since the spacings between the peripherally integrated oval cores of the composite wires and the surfaces of the regions to be joined in the present exemplary embodiment are only 5 μm up to at most 15 μm (12.5 μm in the exemplary embodiment), these regions grow very rapidly with intermetallic phases.

In the process, the bridges of intermetallic phase 11 illustrated in FIG. 3 are formed around the core 4 and between the core 4 and the substrate 9, as well as between the core 4 and the base plate 10.

These intermetallic phases 11 are characterized by a higher strength and hardness and also a higher melting point compared with the soft-solder matrix 2 being used (melting point of the intermetallic phases 11 is dependent on the respective materials being used and is generally ≥415° C.).

After the soldering with the soldering foil 1 according to the invention, and in comparison with soldering using monolithic soft-soldering material, the connection zone between the substrate 9 and the base plate 10 consists not only of ductile soft solder but instead on the one hand of bridges consisting of very strong, temperature-stable intermetallic phases 11 and on the other hand of ductile soft solder of the soft-solder matrix 2 adjoining these bridges.

When these properties are combined in one material, they are known as "tough" in materials science.

After completion of the assembly, this is then used as is generally standard. In the process, the power loss produced in the semiconductor devices in the form of heat is removed via the substrate 9 and the respective soft-solder connection zone of the prior art into the base plate 10.

In the process, the different materials of the individual devices expand to different extents according to their respective coefficients of thermal expansion.

If the operation is stopped intermittently, as is generally standard, for a short or even long time, then power loss in the form of heat is no longer emitted by the semiconductor device, and the materials then cool down and in the process contract.

As a consequence of this constant thermal load cycling, stresses are generated in the materials due to the different expansions. These are concentrated in particular at the peripheral regions of the connection zone.

These peripheral regions of the connection zone are exposed to high stress and strain due to the large number of thermal load cycles over the service life.

This phenomenon is also known as degradation of the solder.

In conventional monolithic soft-solder connections, only the edge regions of the soldered joint/connection zone are affected by cracks in the initial stage.

In the initial stage, the functional capability of the overall structural part is not yet restricted.

In the further continuous operation, these cracks in the soft solder of the connection zone then grow in conventional soft-solder connections until they are under the regions above which the power semiconductor devices sit.

From then on the heat can be removed only very poorly.

Thereby the semiconductor device becomes too hot, then leading to a failure of the entire assembly.

By means of the novel soldered connection formed with the solution according to the invention in the soft-soldering process, a substantially longer life of the entire assembly, such as the entire semiconductor module, for example, can now be assured compared with the prior art.

Figure 4:
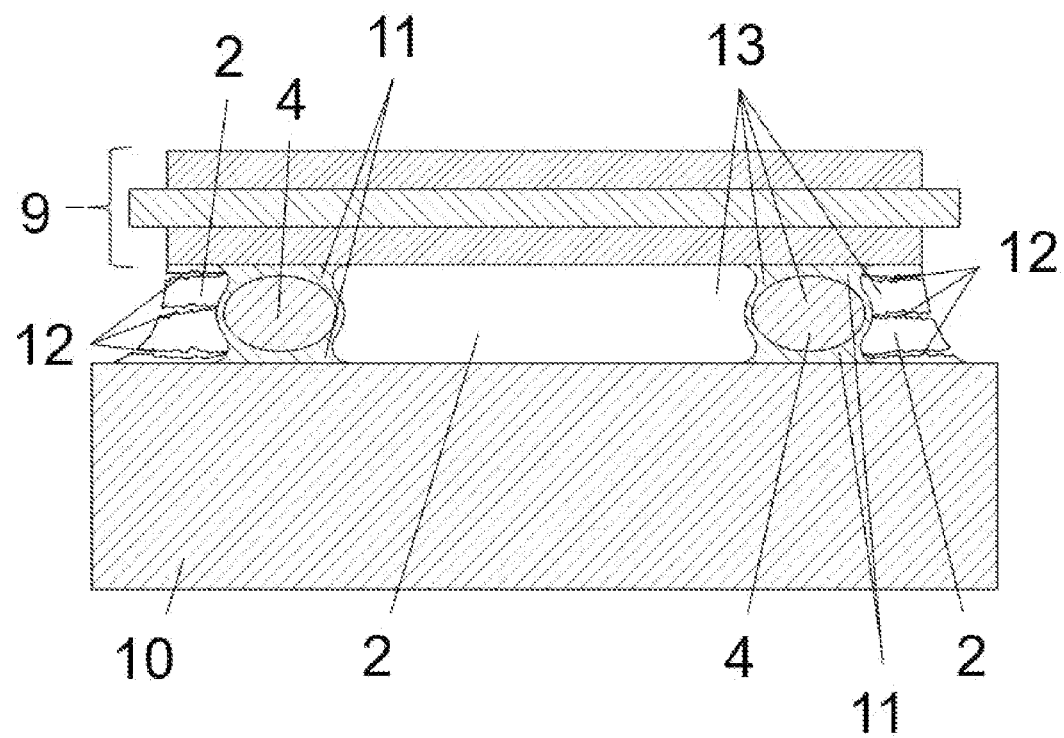
FIG. 4 shows the arrangement illustrated in FIG. 3 after a longer service time in continuous operation.

FIG. 4 shows the soldered connection according to the invention illustrated in FIG. 3 (in conjunction with a power semiconductor module) after longer continuous operation.

From this diagram, it is obvious how the further growth of the cracks 12 is prevented by means of the solution according to the invention.

In conjunction with the stable bridges of intermetallic phases 11, the ductile soft-solder matrix 2 ensures an optimum dissipation of the thermal stresses in the middle of the connection zone 13.

Nevertheless, formation of cracks 12 as a consequence of fatigue phenomena of the soft-solder material can occur at the peripheries of the connection zone 13 after a large number of thermal load cycles.

In this situation, as illustrated in FIG. 4, the bridges of the very strong, intermetallic phases 9 that were formed according to the invention around the copper wires 3 ensure that these cracks 12 are prevented from a further propagation.

Therefore it is imperative and necessarily advantageous to integrate the composite wires 3 as close as possible or as close as needed to the edges/peripheries of the solder preforms 8, in order thereby to prevent a crack (propagation) underneath the regions of the seat of the semiconductor devices.

As a consequence of the composite wires 3 having integrated cores 4 of copper, silver or gold, clad in place in the soldering foil 1, a further, significant improvement of the thermal conductivity of the connection zone 13 is additionally ensured simultaneously compared with the surrounding soft solder, whereby the life of the power semiconductor module is again significantly enhanced.

As a consequence of the significantly improved heat dissipation according to the invention, it is possible that the operating temperatures of the entire assembly will be further lowered and also that thereby the development of thermomechanical stresses will again be significantly reduced.

Figure 5:
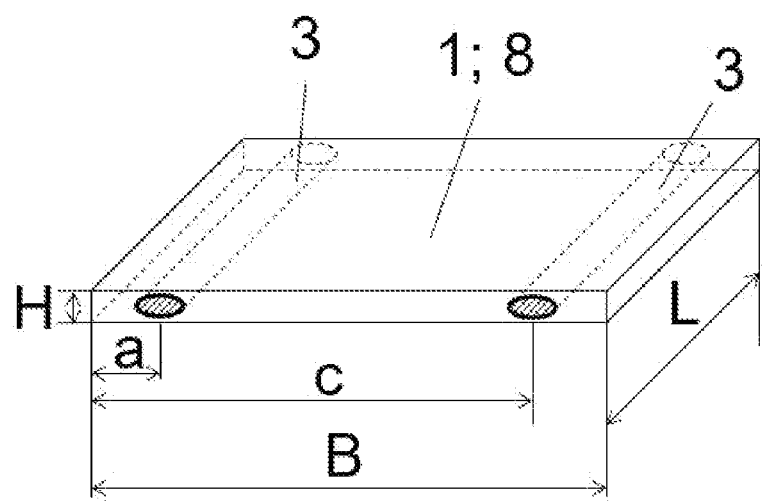
In FIG. 5, a solder preform 8 manufactured from the soldering foil 1 according to the invention and having two composite wires 3 integrated in a soft-solder matrix 2 is shown in a 3D representation.
Figure 6:
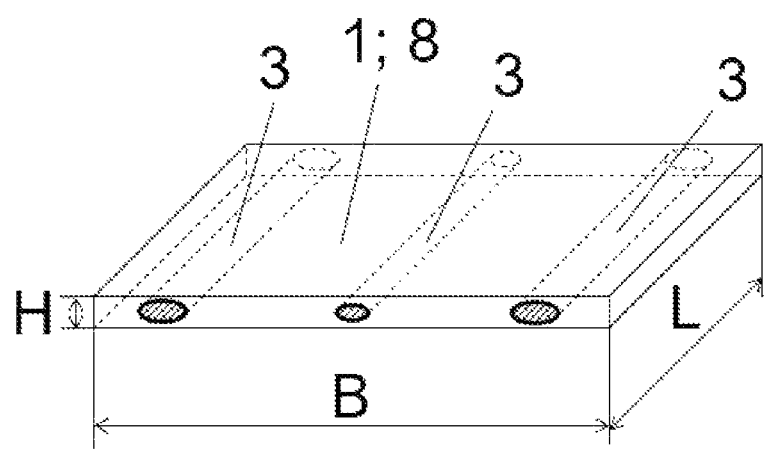
FIG. 6 shows a solder preform 8 manufactured from the soldering foil 1 according to the invention and having three composite wires 3 integrated in a soft-solder matrix 2 in a 3D representation.

In FIGS. 5 and 6, two different solder preforms 8 manufactured from different soldering foils 1 according to the invention are illustrated in 3D views.

FIG. 5 shows, in a 3D representation, a solder preform 8 manufactured from the soldering foil 1 according to the invention having two composite wires 3 integrated/clad in place in a soft-solder matrix 2 for assurance of a homogeneous solder-layer thickness after the soldering process.

In order, for example, to solder a semiconductor device having metallization on the back side on a Cu-ceramic substrate, the solder preforms 8 illustrated in FIG. 5 and manufactured from the soldering foil according to the invention are used with the dimensions of, for example, B=15 mm×L=15 mm.

With the present exemplary embodiment, a connection zone 13 having a height H=100 µm will be ensured.

Since the semiconductor material has no noteworthy sag and the substrate likewise exhibits no noteworthy deviation from a planar surface configuration over the extent of this region, it is sufficient to stabilize the soldered joint with two peripherally located, equally high composite wires 3.

The solder preforms 8 needed for this purpose are fabricated from a solder foil 1 according to the invention, which is manufactured as follows.

Two soft-solder tapes 6 of SnCu3 having the thickness 0.340 mm and width 70.0 mm in conjunction with six separately routed composite wires 3 having a core 4 of copper and a jacket 5 of tin are used as the starting material.

The tapes 6 and composite wires 3 are fed via appropriate guide dies as already explained to the roll gap, and in the process are so aligned relative to one another that the soft-solder tapes 6 again enter the roll gap while coinciding with one another and the composite wires 3 are disposed with exact spacing between them.

In the process, the individually routed composite wires 3 are aligned at a spacing of 10.0 mm relative to one another.

The spacing relative to the tape edges is likewise set at 10.0 mm.

The composite wires 3 consist in the core 4 of hard-drawn copper having a diameter of 500 µm and they have a jacket 5 of 25 µm thick tin.

The composite is clad to a thickness of 220 µm and is reduced to the final thickness of 100 µm with two subsequent roll passes.

From this soldering foil 1 according to the invention, it is now possible to stamp out three solder preforms with the dimensions 15.0 mm×15.0 mm per stamping stroke, continuously over the width.

For this purpose, the stamping die and the seat of the stamp are designed such that a spacing of the stamp relative to the tape edges is 7.5 mm and the stamps have a spacing of 5 mm among one another.

In this way, preforms/molded solder parts 8, in which the two integrated composite wires have a spacing of 2.5 mm relative to their outer edges, are stamped out from the soldering foil 1.

The geometric structure of one of these solder preforms is illustrated in 3D in FIG. 5.

Therein the height of the preform 8 is H=0.100 mm, the width of the preform 8 is B=15.0 mm, the length of the preform 8 is L=15.0 mm.

The composite wires 3 deformed to an oval geometry have the following extent, wherein the larger diameter is approximately 430 µm and the shorter diameter, which subsequently is definitive for the control of a homogeneous solder-layer thickness, has an extent of approximately 84 µm.

The soft-solder column/soft-solder thickness above the composite wires 3 clad in place in the soldering foil 1 according to the invention (with height H=100 µm) is approximately 8 µm at the thinnest location.

According to the invention, these approximately 8 µm thick solder layers are transformed completely into the higher-melting intermetallic phases, in this case Cu6Sn5 and Cu3Sn, during soldering with the soft-soldering profiles typical for the soft soldering, i.e. with the in a process-temperature range typical for the soft soldering, at up to approximately 280° C. and in soldering times of shorter than 5 minutes.

According to the invention, complete bridges of higher-melting intermetallic phases are created in the process along the two composite wires 3 integrated during the soldering process, both toward the substrate surface and toward the back-side metallization of the semiconductor, which bridges, among other possibilities in conjunction with the cores of the wires, ensure that a tilting of the soldered-on semiconductor device in comparison with the substrate is avoided and simultaneously that a highly exact fixation of the semiconductor device relative to the substrate is guaranteed, both for the transport and for a subsequent soldering process in the next oven compartment.

In this subsequent soldering process, the substrate 9 connected with the semiconductor device, for example, is then further soldered with a cooling element.

In the process, the solution according to the invention ensures that neither during transport to a next oven compartment nor during the next soldering process is the semiconductor material already soldered previously with the substrate 9 able to "slip".

With the invention presented here, a solution is presented in which only the regions around the composite wires 3 that have been clad in place will be transformed to higher-melting, strong intermetallic phases 11.

The rest of the connection zone 13 consists of soft solder of the original composition.

Thus sufficient regions exist that compensate by ductile material behavior for the thermomechanical stresses developed during joining and under service conditions, which is not possible in conjunction with a connection zone 13 that consists predominantly of brittle intermetallic phases 11 and may already lead to failure of the semiconductor devices during the soldering process.

FIG. 6 now shows a solder preform 8 having three composite wires 3 integrated in a soft-solder matrix 2.

By means of this solder preform 8, a concave soldered joint will be stabilized during a "substrate 9—to—base plate 10 soldering", which results due to the use of a pre-bent base plate 10 and an associated biconvex substrate 9.

In the process, the two thick composite wires 3 integrated close to the edge will ensure the smallest possible tilting of the substrate 9 and thus the most homogeneous possible solder-layer thickness in a connection zone 13 of approximately 180 μm.

A third, centrally situated composite wire 3 having smaller thickness will stabilize the concave soldered joint.

For the manufacture of the soldering foil 1 according to the invention as starting material for the manufacture of the solder preforms 8, two brushed tapes 6 of SnAg3.5 having a thickness of 0.470 mm and a width of 70 mm are used, as are three composite wires 3 with copper as the material for the core 4 and a galvanic tin coating of the core 4 as the jacket 5, in the hard-drawn condition.

The two peripherally disposed composite wires 3 are round, prior to the roll cladding possess an outside diameter of 0.8 mm and have a layer thickness of the jacket 5 of tin of approximately 25 μm.

The third, the central composite wire 3 possesses a diameter of 0.55 mm and likewise has a jacket 5 of tin of approximately 25 μm.

The lower brushed tape 6 is threaded from an unwinder through the opened roll gap, past a guide die, and fed to a winding unit.

The central composite wire 3 is threaded from a spool through a guide die and aligned exactly at the center of the lower brushed tape 6.

The central composite wire 3 becomes fixed on the outlet side.

Thereupon a peripheral composite wire 3 having the outside diameter of 0.800 mm is unwound from a spool and threaded through a guide die then disposed to the right of the centrally routed composite wire.

The spacing relative to the centrally routed composite wire will be 20 mm in this exemplary embodiment.

Thereby a spacing of 15 mm results relative to the right periphery of the SnAg3.5 tape 6 situated under the composite wire.

The third composite wire 3, which will be routed to the left of the center of the tape 6 and which likewise has a diameter of 0.800 mm, is unwound from a spool, threaded through a guide die and disposed at a spacing of likewise 20 mm relative to the centrally routed composite wire.

The composite wires 3 routed on the left and right of the center likewise become fixed on the outlet side of the rolls.

Finally, the upper SnAg3.5 tape 6 is threaded through the roll gap in a manner coinciding with the lower SnAg3.5 tape 6 as seen in side arrangement, and in the process likewise passes a guide die.

The roll gap between the rolls 7 is then adjusted such that a soldering foil 1 according to the invention having a thickness of 0.350 mm is obtained.

In the process, the round composite wire cross sections are molded in place between the SnAg3.5 foils and enclosed by soft solder.

By means of two successive roll passes, the thickness of the soldering foil 1 according to the invention is then further reduced to 180 μm.

The soldering foil 1 according to the invention, manufactured in this way, has a rectangular cross section with a height H=0.18 mm and a width of approximately 70 mm, with a soft-solder matrix of SnAg3.5.

The composite wires 3 squeezed/deformed to oval shape are embedded in the soft-solder matrix, centrally/symmetrically relative to the centroid of the rectangular cross section.

The smaller diameter of the middle wire is approximately 120 μm and its largest diameter is approximately 395 μm.

The two peripherally disposed composite wires 3 are likewise deformed to oval formats, with approximately 155 μm for the smaller diameter of the oval and approximately 620 μm for the larger diameter of the oval.

The centroids of these ovals are always in the middle, meaning at half height of the total thickness/total height, in the soldering foil 1 according to the invention.

Due to the guide dies, it is simultaneously ensured that the spacings of the centroids of the composite wire ovals are maintained at equal distances over the entire roll-cladding process.

Subsequently, stamped parts, so-called "preforms", having the following dimensions (see FIG. 5): height H=180 m; width B=46.5; length 38.0 mm, are stamped out of this soldering foil 1 according to the invention.

The stamped parts can be manufactured from this soldering foil 1 according to the invention, manufactured as explained above, from a (practical) minimum width B of 43.0 mm up to the maximum width B of the tape of 70.0 mm.

Theoretically, the length L of the solder preforms 8 could usefully be 5.0 mm up to greater than 100 mm.

In the soft-soldering process, a peak temperature in the soldering profile of 250° C.-260° C. is used for working with this soldering foil 1 according to the invention.

Under these conditions the SnAg3.5 solder becomes molten.

The same is true for the tin jacket of the copper wires.

Due to the transformation according to the invention of a part of the soft solder in the region of the composite wires 3 into the intermetallic phases $Cu_6Sn_5$ and $Cu_3Sn$, the proportion of the molten soft solder that is situated over and under the peripheral composite wires decreases, so that the value by which the substrate is absolutely able to tilt is ≤10 μm.

The central composite wire, since it is dimensioned to be somewhat thinner in its structure, permits a shortening of the spacing between the lower edge of the substrate 9 and the upper edge of the base plate, so that a concave shape for the soldering gap is made possible. Simultaneously, it prevents excessive sinking, i.e. solution of the substrate underside toward the base-plate upper side at the center.

In this way the substrate 9 is braced by three composite wires 3.

The central composite wire 3 also prevents the peripheral composite wires 3 from being able to be squeezed out during soldering, if the overall structure were to be exposed to a high pressing pressure in the soldering process.

With the material according to the invention, the following advantages are also combined with one another: on the one hand, that the crack growth in case of material fatigue is blocked at the locations around the wires and thus the life of the soldered joints is prolonged; on the other hand, that, due to the presence of large regions of ductile soft solder, a joining of materials that cause large thermomechanical stresses on the basis of different thermal expansion behavior is permitted.

By means of the teaching according to the invention, therefore, a novel soldering foil 1 is provided that permits the adjustment of a defined and reproducible connection-zone geometry, regardless of simple or else complex configuration after the soldering process, and that is also suitable for stepwise soldering processes, in order that, with a soldering profile typical for the soft soldering, i.e. in a process-temperature range typical for the soft soldering, i.e. at preferably 250 to 300° C., and in soldering times of shorter than 5 minutes, and also without a subsequent heat treatment and without the exertion of a pressing pressure during the soldering, with simultaneous prevention of the formation of pores and or blowholes in the connection zone, the slipping of soldered components even during so-called stepwise soldering processes, in which the danger of a remelting of previously soldered regions exists, is prevented by the fact that complete bridges of higher-melting, intermetallic phases, which are strongly bound with high geometric exactness to the metallic/metallized surface layers of the devices to be soldered and are exactly defined in their dimensions and their spacings are formed during the soldering process, which bridges have a remelting temperature of higher than 400° C., and which ensure a connection zone that is highly accurate and geometrically exact in the dimensions and that, in addition, due to the mechanical strength of these temperature-stable bridges, simultaneously prevent/stop a crack propagation in the connection zone in case of material fatigue of the solder directly at the bridges, wherein the soft solder surrounding the bridges, the soft-solder matrix, simultaneously absorbs the thermomechanical stresses introduced by the soldering but also developed during the device service and thereby counteracts a material fatigue, whereby, in operative general context, the solution presented here significantly extends the life of the connection zone compared with a connection zone manufactured with conventional soldering materials according to the prior art in mounting and connection technology, and in the process significantly improves the thermal conductivity of the entire connection zone as a consequence of the embedded wires of Cu (or Ag, or Ni, etc.).

SUMMARY OF THE REFERENCE SYMBOLS

1 Soldering foil
2 Soft-solder matrix
3 Composite wire
4 Core
5 Jacket
6 Tape (foil)
7 Roll
8 Solder preform
9 Ceramic substrate
10 Base plate
11 Intermetallic phase
12 Crack
13 Connection zone
H Height
B Width
L Length
a Spacing relative to periphery
c Spacing

The invention claimed is:

1. A lead-free soldering foil (1) having a thickness of 50 μm to 600 μm, in order to connect metallic devices (2) and/or metallized/metal-coated devices (2) with one another, wherein the soldering foil (1) has tape edges and is structured such that, in a soft solder matrix (2), two or more wires are respectively disposed individually, parallel to one another and parallel to the tape edges, wherein these wires respectively disposed individually in the soldering foil (1) are formed as composite wires (3), which have a core (4), which comprises a metal that is higher-melting and at the same time stronger compared with the soft-solder matrix (2), or a metal alloy, of copper or a copper-base alloy, silver or silver-base alloys, nickel or nickel base alloys, gold or gold-base alloys, around which a jacket (5) of a different metal or of a different metal alloy, of pure tin or a tin-base alloy, or of indium or an indium-base alloy is disposed; and the jacket (5) of the composite wires (3) has a layer thickness of 2% to 20% relative to the total diameter of the composite wire (3); and the composite wires (3), aligned along the rolling direction between two soft-solder foils or two soft-solder tapes, are clad in place by means of roll cladding in a "percentage height reduction of the starting tapes", determined from the difference between the total starting height of the tapes (6) (determined without including the height of the composite wires (3)) and the final height H of the composite foil (1) (with embedded composite wires (3)) relative to the total starting height of the tapes (6), in percent, in the range from greater than 30% to at most 95% and thereby are disposed in substance-to-substance relationship in the soft-solder matrix; and after the roll-cladding process, over and under at least one of the cores (4) of the composite wires (3) clad in place in the soft-solder matrix (2), a layer of soft-solder materials is still disposed, which is composed of the region of the soft-solder matrix (2) and the layer of the jacket (5) of the composite wires (3), and which in total then measures at least 5 μm but at most 15 μm at the thinnest location.

2. The lead-free soldering foil (1) according to claim 1, wherein the soft-solder matrix (2) comprises either lead-free tin-base solders, pure tin, pure indium or alloys on the basis of indium.

3. The lead-free soldering foil (1) according to claim 1, wherein the jacket (5) of the composite wires (3) is produced galvanically or by dipping the core (4) in metal melts.

4. The lead-free soldering foil (1) according to claim 1, wherein composite wires (3) having round or oval cross section are used as the composite wires (3).

5. The lead-free soldering foil (1) according to claim 1, wherein the composite wires (3) used in a soldering foil (1) all have the same cross-sectional dimensions in the initial condition.

6. The lead-free soldering foil (1) according to claim 1, wherein the composite wires (3) used in a soldering foil (1) have different cross-sectional dimensions in the initial condition.

7. The lead-free soldering foil (1) according to claim 1, wherein the minimum permissible spacing between the cores (2) of the composite wires (3) is approximately 500 μm after the rolling process, and the minimum permissible spacing of the cores (2) of the composite wires (3) relative to the outer edge of the soldering foil is approximately 500 μm after the rolling process.

8. The lead-free soldering foil (1) according to claim 1, wherein the cores (4) of all composite wires (3) used in a soldering foil (1) comprise a uniform core material and the jackets (5) of all composite wires (3) used in a soldering foil (1) comprise a uniform jacket material.

9. The lead-free soldering foil (1) according to claim 1, wherein the cores (4) of all composite wires (3) used in a soldering foil (1) comprise various core materials and also the jackets (5) of all composite wires (3) used in a soldering foil (1) comprise different jacket materials.

10. The lead-free soldering foil (1) according to claim 1, wherein the "percentage height reduction of the starting tapes" lies in the range of 50% to 85%.

\* \* \* \* \*